United States Patent
Thompson et al.

(10) Patent No.: US 9,664,750 B2
(45) Date of Patent: May 30, 2017

(54) IN-PLANE SENSING LORENTZ FORCE MAGNETOMETER

(71) Applicant: Invensense, Inc., Sunnyvale, CA (US)

(72) Inventors: Matthew Julian Thompson, Corvallis, OR (US); Joseph Seeger, Menlo Park, CA (US)

(73) Assignee: INVENSENSE, INC., San Jose, CA (US)

( * ) Notice: Subject to any disclaimer, the term of this patent is extended or adjusted under 35 U.S.C. 154(b) by 575 days.

(21) Appl. No.: 13/731,301

(22) Filed: Dec. 31, 2012

(65) Prior Publication Data

US 2014/0184213 A1    Jul. 3, 2014

Related U.S. Application Data

(63) Continuation-in-part of application No. 13/004,383, filed on Jan. 11, 2011, now Pat. No. 8,947,081, and a (Continued)

(51) Int. Cl.
*G01R 33/02* (2006.01)
*G01R 33/028* (2006.01)
(Continued)

(52) U.S. Cl.
CPC ............ *G01R 33/0286* (2013.01); *G03F 1/00* (2013.01); *H01H 1/00* (2013.01); *H02K 1/00* (2013.01)

(58) Field of Classification Search
CPC ........ G03F 1/00; H02K 1/00; H02K 2201/00; H02K 2203/00; G02B 1/00; G02B 2207/00; H01H 1/00
(Continued)

(56) References Cited

U.S. PATENT DOCUMENTS 5,083,466 A    1/1992 Holm-Kennedy et al.
5,142,921 A    9/1992 Stewart et al.
(Continued)

FOREIGN PATENT DOCUMENTS

WO    WO 02/42716    5/2002
WO    WO 03/038449   5/2003

OTHER PUBLICATIONS

Jukka Kyynarainen, et al., "A 3D micromechanical compass", ScienceDirect, Sep. 2008.

(Continued)

*Primary Examiner* — Jermele M Hollington
*Assistant Examiner* — Temilade Rhodes-Vivour
(74) *Attorney, Agent, or Firm* — Maryam Imam; Klintworth & Rozenblat IP LLC

(57) ABSTRACT

A magnetic field sensor includes a driving element through which an electric current circumnavigates the driving element. A Lorentz force acts on the driving element resulting in a torque about a first axis in response to a magnetic field along a second axis substantially parallel to a plane of a substrate. The driving element is coiled-shaped. A sensing element of the magnetic field sensor is configured to rotate about the first axis substantially parallel to the plane of the substrate in response to the magnetic field and a coupling element mechanically couples the driving element to the sensing element. The driving element, the sensing element, and the coupling element are disposed in the plane, substantially parallel to the substrate. At least two anchors are configured to connect the driving element, the sensing element, and the coupling element to the substrate.

33 Claims, 5 Drawing Sheets

Related U.S. Application Data continuation-in-part of application No. 13/004,365, filed on Jan. 11, 2011, now Pat. No. 8,860,409.

(51) Int. Cl.
   *H01H 1/00* (2006.01)
   *G03F 1/00* (2012.01)
   *H02K 1/00* (2006.01)

(58) Field of Classification Search
   USPC .................................................. 324/244.1
   See application file for complete search history.

(56) References Cited

U.S. PATENT DOCUMENTS

| | | | |
|---|---|---|---|
| 5,249,732 A | 10/1993 | Thomas | |
| 5,359,893 A | 11/1994 | Dunn | |
| 5,426,070 A | 6/1995 | Shaw et al. | |
| 5,485,032 A | 1/1996 | Schepis et al. | |
| 5,656,778 A | 8/1997 | Roszhart | |
| 5,659,195 A | 8/1997 | Kaiser et al. | |
| 5,693,574 A | 12/1997 | Schuster et al. | |
| 5,703,293 A | 12/1997 | Zabler et al. | |
| 5,780,740 A | 7/1998 | Lee et al. | |
| 5,895,850 A | 4/1999 | Buestgens | |
| 5,915,168 A | 6/1999 | Salatino et al. | |
| 5,959,452 A | 9/1999 | Givens et al. | |
| 5,992,233 A | 11/1999 | Clark | |
| 5,996,409 A | 12/1999 | Funk et al. | |
| 6,036,872 A | 3/2000 | Wood et al. | |
| 6,122,961 A | 9/2000 | Geen et al. | |
| 6,128,961 A | 10/2000 | Haronian | |
| 6,153,917 A | 11/2000 | Matsunaga et al. | |
| 6,189,381 B1 | 2/2001 | Huang et al. | |
| 6,199,748 B1 | 3/2001 | Zhu et al. | |
| 6,229,190 B1 | 5/2001 | Bryzek et al. | |
| 6,250,157 B1 | 6/2001 | Touge | |
| 6,275,034 B1 | 8/2001 | Tran et al. | |
| 6,391,673 B1 | 5/2002 | Ha et al. | |
| 6,426,687 B1 | 7/2002 | Osborn | |
| 6,430,998 B2 | 8/2002 | Kawai et al. | |
| 6,433,411 B1 | 8/2002 | Degani et al. | |
| 6,448,109 B1 | 9/2002 | Karpman | |
| 6,452,238 B1 | 9/2002 | Orcutt et al. | |
| 6,479,320 B1 | 11/2002 | Gooch | |
| 6,480,320 B2 | 11/2002 | Nasiri | |
| 6,481,283 B1 | 11/2002 | Cardarelli | |
| 6,481,284 B2 | 11/2002 | Geen et al. | |
| 6,496,348 B2 | 12/2002 | McIntosh | |
| 6,508,122 B1 | 1/2003 | McCall et al. | |
| 6,513,380 B2 | 2/2003 | Reeds, III et al. | |
| 6,519,075 B2 | 2/2003 | Carr et al. | |
| 6,528,344 B2 | 3/2003 | Kang | |
| 6,528,887 B2 | 3/2003 | Daneman et al. | |
| 6,533,947 B2 | 3/2003 | Nasiri et al. | |
| 6,555,417 B2 | 4/2003 | Spooner et al. | |
| 6,559,530 B2 | 5/2003 | Hinzel et al. | |
| 6,621,137 B1 | 9/2003 | Ma et al. | |
| 6,635,509 B1 | 10/2003 | Ouellet | |
| 6,650,455 B2 | 11/2003 | Miles | |
| 6,660,564 B2 | 12/2003 | Brady | |
| 6,664,786 B2 | 12/2003 | Kretschmann et al. | |
| 6,686,639 B1 | 2/2004 | Tsai | |
| 6,770,569 B2 | 8/2004 | Foerstner et al. | |
| 6,794,272 B2 | 9/2004 | Turner et al. | |
| 6,796,178 B2 | 9/2004 | Jeong et al. | |
| 6,808,955 B2 | 10/2004 | Ma | |
| 6,852,926 B2 | 2/2005 | Ma et al. | |
| 6,892,575 B2 | 5/2005 | Nasiri et al. | |
| 6,918,297 B2 | 7/2005 | MacGugan | |
| 6,936,491 B2 | 8/2005 | Partridge et al. | |
| 6,936,494 B2 | 8/2005 | Cheung | |
| 6,939,473 B2 | 9/2005 | Nasiri et al. | |
| 7,004,025 B2 | 2/2006 | Tamura | |
| 7,028,547 B2 | 4/2006 | Shiratori et al. | |
| 7,064,541 B2 | 6/2006 | Richards et al. | |
| 7,104,129 B2 | 9/2006 | Nasiri et al. | |
| 7,196,404 B2 | 3/2007 | Schirmer et al. | |
| 7,433,267 B2 | 10/2008 | Murphy et al. | |
| 7,557,470 B2 * | 7/2009 | Culpepper | B81B 3/0062 310/15 |
| 7,990,595 B1 * | 8/2011 | Chou et al. | 359/198.1 |
| 2002/0051258 A1 | 5/2002 | Tamura | |
| 2003/0074967 A1 | 4/2003 | Tang et al. | |
| 2003/0110858 A1 | 6/2003 | Kim et al. | |
| 2003/0164041 A1 | 9/2003 | Jeong et al. | |
| 2004/0055380 A1 | 3/2004 | Shcheglov et al. | |
| 2004/0150398 A1 | 8/2004 | Champion et al. | |
| 2005/0081633 A1 | 4/2005 | Nasiri et al. | |
| 2005/0170656 A1 | 8/2005 | Nasiri et al. | |
| 2005/0274186 A1 * | 12/2005 | Dean | G01C 19/5719 73/514.14 |
| 2006/0267596 A1 * | 11/2006 | Cumpson | G01Q 40/00 324/601 |
| 2007/0030001 A1 | 2/2007 | Brunson et al. | |
| 2007/0039147 A1 | 2/2007 | Shimanouchi et al. | |
| 2007/0096729 A1 | 5/2007 | Brunson et al. | |
| 2008/0122431 A1 * | 5/2008 | Berkcan et al. | 324/126 |
| 2009/0015250 A1 * | 1/2009 | Sunier | G01R 33/028 324/244 |
| 2009/0193892 A1 * | 8/2009 | Seeger | 73/504.12 |
| 2010/0149614 A1 * | 6/2010 | Chou et al. | 359/200.7 |
| 2010/0302617 A1 * | 12/2010 | Zhou | G02B 26/08 359/291 |
| 2012/0176129 A1 * | 7/2012 | Seeger | G01R 33/038 324/252 |
| 2013/0096825 A1 * | 4/2013 | Mohanty | G01C 21/165 701/472 |
| 2013/0180332 A1 * | 7/2013 | Jia | G01C 19/5762 73/504.12 |
| 2014/0028410 A1 * | 1/2014 | Pedersen | H03H 9/02259 331/154 |
| 2014/0049256 A1 * | 2/2014 | Smith | G01R 33/0286 324/259 |

OTHER PUBLICATIONS

A L Herrera-May, et al., "A resonant magnetic field microsensor with high quality factor at atmospheric pressure", Journal of Micromechanics and Microengineering, Nov. 2008.

Behraad Bahreyni and Cyrus Shafai, "A Resonant Micromachined Magnetic Field Sensor", IEEE Sensors Journal, vol. 7, No. 9, Sep. 2007.

JLorg R. Kaienburg, Michael Huonker, and Ralf Schellin, "Surface Micromachined Bridge Configurations for Accurate Angle Measurements", Automotive Equip. Div. 8, Dept. K8/SPP, Robert Bosch GmbH, Germany, 2000.

V. Beroulle, Y. Bertrand, L. Latorre and P. Nouet, "Test and Testability of a Monolithic MEMS for Magnetic Field Sensing", Journal of Electronic Testing: Theory and Applications 17, 439-450, 2001.

Vincent Beroulle, Yves Bertrand, Laurent Latorre, and Pascal Nouet, "Micromachined CMOS Magnetic Field Sensors With Low-Noise Signal Conditioning", 0-7803-7185—Feb. 2002 IEEE.

N. Dumas, L. Latorre and P. Nouet, "Design of a Micromachined CMOS Compass", Proceedings of 27th European Solid-State Circuits Conference (ESSCIRC), Villach, Austria, Sep. 18-20, 2001.

N. Dumas, L. Latorre, P. Nouet, "Development of a low-cost piezoresistive compass on CMOS", ScienceDirect, Feb. 2006.

Thierry C. Leichle, Martin von Arx and Mark G. Allen, "A Micromachined Resonant Magnetic Field Sensor", 0-7803-5998, Apr. 2001.

Harald Emmerich and Martin Schöfthaler, "Magnetic Field Measurements with a Novel Surface Micromachined Magnetic-Field Sensor", IEEE Transactions on Electron Devices, vol. 47, No. 5, May 2000.

Zs. Kfidfir, A. Bossche, P.M. Sarro and J.R. Mollinger, "Magnetic-field measurements using an integrated resonant magnetic-field sensor", Sensors and Actuators A 70 (1998) 225-232.

(56) References Cited

OTHER PUBLICATIONS

Zsolt IGdiir, Andre Bossche and Jeff Mollinger, "Integrated resonant magnetic-field sensor", Sensors and Actuators A, 41-i2 (1994) 66-69.

Dennis K. Wickenden, John L. Champion, R. Ben Givens, Thomas J. Kistenmacher, Jay L. Lamb, and Robert Osiander, "Polysilicon xylophone bar magnetometers", Part ofthe SPIE Conference on Micromached Devices and Components V, Santa Clara, California, Sep. 1999, SPIE Digital Library on Nov. 2, 2009.

Eugene Zakar, et al., "PZT MEMS for an Extremely Sensitive Magnetometer", aU.S. Army Research Laboratory, SEDD, 2800 Powder Mill Rd., Adelphi, Maryland 20783, USA, Jul. 25, 2003.

Dahai Ren, Lingqi Wu, Meizhi Yan, Mingyang Cui, Zheng You and Muzhi Hu, "Design and Analyses of a MEMS Based Resonant Magnetometer", Sensors 2009, 9, 6951-6966.

Beverley Eyre and Linda Miller, "MEMS Magnetic Sensor in Standard CMOS", Science Closure and Enabling Technologies for Constellation Class Missions, pp. 99-102, UC Berkeley, California 1998.

Beverley Eyre and Kristofer S. J. Pister, "Micromechanical Resonant Magnetic Sensor in Standard CMOS", IEEE, 74(8):1107{1132, Aug. 1986.

Matthew J. Thompson and David A. Horsley, "Parametrically Amplified MEMS Magnetometer", 978-1-4244-4193, Aug. 2009, IEEE.

Dennis K. Wickenden, John L. Champion, R. Ben Givens, Thomas J. Kistenmacher, Jay L. Lamb, and Robert Osiander, "Polysilicon Xylophone Bar Magnetometers", Solid-State Sensor and Actuator Workshop, Jul. 2000.

F. D. Bannon III, et al., "High frequency microelectromechanical IF filters," Technical Digest, IEEE International Election Devices Meeting, San Francisco, California, Dec. 8-11, 1996, pp. 773-776.

Bao Vu, et al., "Patterned eutectic bonding with Al—Ge thin films for microelectromechanical systems," May 31, 1996, pp. 2588-2594.

Sumant Sood, et al., "Al—Ge Eutectic Wafer Bonding and Bond Characterization for CMOS Compatible WaferPackaging", SVTC Technologies, May 8, 2010, pp. 1-8.

Supplementary European Search Report dated Jul. 20, 2010, application No. 06737697.0-1528/ 1859475, PCTUS2006008543.

Notification of Transmittal of the International Search Report and the Written Opinion of the International SearchingAuthority or the Declaration, issued in International Application No. PCT/US06/44919, Feb. 7, 2008.

* cited by examiner

IN-PLANE SENSING LORENTZ FORCE MAGNETOMETER

CROSS REFERENCE TO RELATED APPLICATIONS

This application is a continuation-in-part application of U.S. patent application Ser. No. 13/004,383, filed on Jan. 11, 2011, by Seeger et al., and entitled "Micromachined Resonant Magnetic Field Sensors" and a continuation-in-part of U.S. patent application Ser. No. 13/004,365, filed on Jan. 11, 2011, by Seeger et al., and entitled "Micromachined Resonant Magnetic Field Sensors", the disclosures of both of which are incorporated herein by reference as though set forth in full.

BACKGROUND

Various embodiment of the invention relate generally to a directional magnetometer and particularly to a MEMS Lorentz force magnetometer A directional magnetometer is a sensor that measures magnetic field along an axis. An ideal in-plane magnetometer is sensitive to magnetic field that is parallel to the planar geometry of the magnetometer. An ideal out-of-plane magnetometer is sensitive to magnetic field in the direction perpendicular to the planar geometry of the magnetometer. For high volume, low cost production it is advantageous to use the same fabrication methods as other micro-machined inertial sensors like accelerometers and gyroscopes. A MEMS Lorentz force magnetometer is such a sensor.

A MEMS Lorentz force magnetometer has a drive subsystem where an electric current flows through the drive subsystem and a Lorentz force acts on the drive subsystem resulting in motion about a first axis in response to a magnetic field along a second axis substantially parallel to the plane of a substrate.

However, unwanted forces can arise on a MEMS device with a MEMS Lorentz force magnetometer from off axis magnetic field, electronic noise sources, exogenous linear acceleration and other sources. If these forces are not balanced about the rotational axis they will cause motion and will be undesirably detected by the sensing element and misinterpreted as a Lorentz force. They will be indistinguishable from magnetic generated motion and will cause cross axis error, offset and additional noise.

Thus there is a need for MEMS magnetometers to measure magnetic fields with increased accuracy and reduced noise and size.

SUMMARY

Briefly, an embodiment of the invention includes a magnetic field sensor having a driving element through which an electric current circumnavigates the driving element. The driving element is coiled-shaped. A Lorentz force acts on the driving element resulting in a torque about a first axis in response to a magnetic field along a second axis substantially parallel to the plane of a substrate. A sensing element of the magnetic field sensor is configured to rotate about the first axis substantially parallel to the plane of the substrate in response to the magnetic field along a second axis. A coupling element mechanically couples the driving element to the sensing element. The driving element, the sensing element, and the coupling element are disposed in the plane, substantially parallel to the substrate. At least two anchors are configured to connect the driving element, the sensing element, and the coupling element to the substrate.

A further understanding of the nature and the advantages of particular embodiments disclosed herein may be realized by reference of the remaining portions of the specification and the attached drawings.

DETAILED DESCRIPTION OF EMBODIMENTS

The following description describes a magnetic field sensor. In one embodiment of the invention, the magnetic field sensor has two perpendicular single axis sensors that are used to measure both in-plane magnetic fields.

As shown and described herein, a sensing subsystem is used to detect the motion of the drive subsystem and the drive and sense subsystems are disposed on a common plane. An embodiment of the invention is an in-plane sensing having micromachined Lorentz force magnetometer structures with the added improvements of increased Lorentz force transduction, lower errors and a single structure magnetometer with dual in-plane magnetic sensing. Related and previously-filed patent applications are U.S. patent application Ser. No. 13/004,365, filed Jan. 11, 2011, and Ser. No. 13/004,383, filed Jan. 11, 2011, which describes a method for shielding the drive subsystem to minimize unwanted electrostatic actuation and dual mass magnetometers.

Increased Lorentz force transduction for in-plane magnetometers is achieved by increasing the length of the Lorentz force beam by using partial coils, single coils and multi-coils drive structures. A coil is defined as a structure where the current circumnavigates the coil in a clockwise or anticlockwise direction. The more turns in the coil structure the more Lorentz force transduction and the more Lorentz force is applied to the MEMS structure increasing its sensitivity to magnetic field.

To save space and cost, a single magnetometer is described which can measure magnetic field in two directions.

Figure 1:
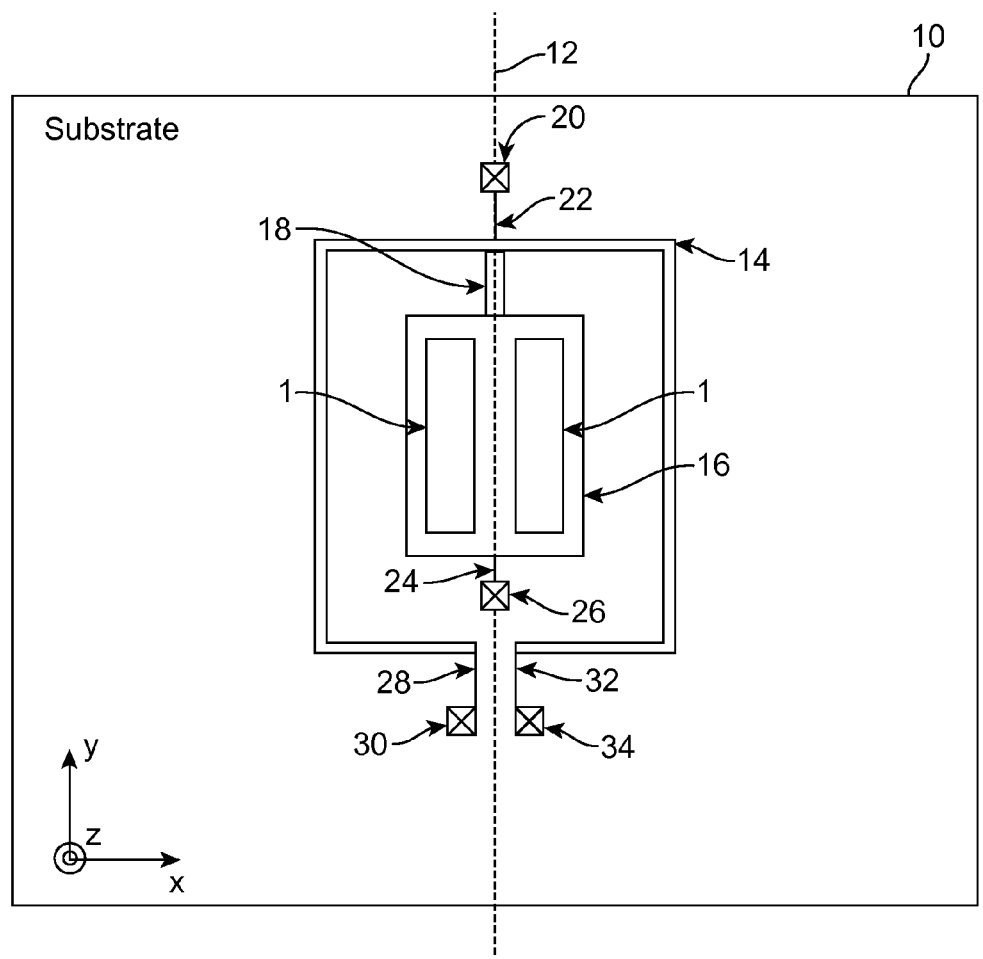
FIG. 1 shows a magnetic field sensor, in accordance with an embodiment of the invention.

Referring to FIG. 1, a magnetic field sensor 10 (also known herein as a "magnetometer") is shown, in accordance with an embodiment of the invention. Sensor 10 is shown to be generally symmetrical about axis 12 and includes: a drive anchor 20, a drive spring 22, a driving element 14, a sensing element 16, a sensing spring 24, sense anchor 26, a drive anchor 30 and 34, a drive spring 32, a drive spring 28, a coupling element 18, and a pair of electrodes 1, all of which are parallel and suspended from a substrate. Similar to sensor 10, as depicted in FIG. 1, the driving element 14 is shown to be generally symmetrical about axis 12. The sensing element 16, the coupling element 18, and the driving element 14 are all shown coupled to the substrate.

Sensor 10 can be realized using MEMS fabrication.

The driving element 14 is coil-shaped. Coil shape is defined as any structure that would cause the drive current to fully or partially circumnavigate around an axis. The driving element 14 and the sensing element 16 are shown coupled to each other by the coupling element 18. The drive spring 32 couples the drive anchor 34 to the drive coil 14 and the drive spring 28 couples the drive anchor 30 to the drive coil 14. Similarly, the drive spring 22 couples the drive anchor 20 to the drive coil 14. The electrodes 1 are disposed between the sensing element 16 and substrate 10 and each on either side of the axis 12

In operation, an electric current flows through the driving element, a Lorentz force acts on the driving element 14 resulting in a torque about an axis, such as axis 12 in FIG. 1, in response to a magnetic field along another axis, such as the x-axis. The sensing element 16 rotates about axis 12 in response to the magnetic field. Accordingly, sensor 10 is an exemplary embodiment of an x-axis, in-plane, sensing Lorentz force magnetometer with a single coil structure. In such a structure, the Lorentz current circumnavigates one complete circle around the sensor.

Sensor 10 is suspended from the substrate and is parallel to the substrate. The driving element 14 is suspended from the drive springs 22, 32, and 28 and it is anchored to the substrate via the drive anchors 20, 34, and 30, respectively. The sensing element 16 is suspended by the sense spring 24 which is anchored to the substrate with the sense anchor 26. As previously noted, the driving element 14 and the sensing element 16 are coupled together with the coupling element 18.

The current path is made low resistance to reduce power consumed in the driving element 14. A low resistance driving element can be manufactured using low resistance highly-doped silicon. Preferably, the highly doped silicon has resistivity less the 5 mOhm-cm. Low resistance can also be achieved using silicon with a low resistance material such as Aluminum, deposited/bonded on top thereof.

The sense subsystem, defined by the sensing element 16, the coupling element 18, and the driving element 14, rotates about axis 12 causing an out-of-plane motion. A sensing mechanism is used to detect the out-of-plane motion of the sensing element 16. The sensing mechanism can be an electrode between the sense element and the substrate to form a capacitive sensor, where in capacitance of the capacitive sensor changes in response to magnetic field. The sense subsystem forms a variable capacitor using fixed electrodes, i.e. electrodes 1, placed between the sensing element 16 and substrate 10. The electrodes 1 form a capacitive sensor, wherein capacitance of the capacitive sensor changes in response to magnetic field. In another embodiment the sensing mechanism can be an optical interferometer sensor, where the interferometer signal changes in response to magnetic field. In another embodiment the sensing mechanism can be a piezoresistive sensor, where in resistivity of the piezoresistor sensor changes in response to magnetic field.

An alternating current (AC) voltage potential is applied between drive anchor 30 and drive anchor 34 causing an AC current to circumnavigate the driving element 14. In the presence of an x-axis magnetic field, the current flowing in the drive coil along the y-axis causes Lorentz forces to couple and create a Lorentz torque about axis 12. This torque causes the sensing element 16 to rotate about axis 12 causing an out-of-plane motion of the sensing element 16. The motion of the driving element 14 is transferred to the sensing element 16 via the coupling element 18. The out-of-plane motion of the sensing element 16 is measured to determine the x-axis magnetic field.

If an off axis y-axis magnetic field is applied to the x axis magnetic sensor. The current flowing in the x axis causes Lorentz forces to be applied to the driving element 14 however, these Lorentz forces are balanced about the axis of rotation 12 and no Lorentz torque is created. Therefore no net motion is caused and off axis magnetic fields are not sensed. If a z-axis magnetic field is applied, then in-plane forces are generated and rejected by the sensing element 16, which only detects out-of-plane motion.

In an embodiment of the invention, the coupling element is made using the same or uniform material as the sense element and in another embodiment, the coupling element is made of different materials. To electrically isolate the drive voltage to the sensing voltage and electrical insulating material can be used.

In some embodiments, the driving element 14 is made with the same material as the sense element which simplifies the manufacturing and reduces the cost of fabrication the sensor 10.

In some embodiments, the sensing element 16 is constructed using an electrically conductive material. In some embodiments, sensing element 16 is made of the same material and in other embodiments, sensing element 16 is made of different materials as suitable for the drive system.

In some embodiments, the out-of-plane motion of the sense element 16 caused from x-axis magnetic field is measured by placing an electrode underneath sense element 16 to measure the change in capacitance. In some embodiments, the out-of-plane motion of the sense element, of sensor 10, is detected using an optical interferometry sensor where the interferometer signal changes in response to magnetic field. An interferometer uses the wave properties of light to measures the distance between an object and a reference point. Here the interferometer will measure the relative motion of the sense element 16 and the substrate. In some embodiments, the out-of-plane motion of the sense element, of sensor 10, is detected using a piezoresistive sensor where resistivity changes in response to a magnetic field Accordingly, two perpendicular single axis sensors 10 are required to measure both the in-plane magnetic field axes.

Figure 2:
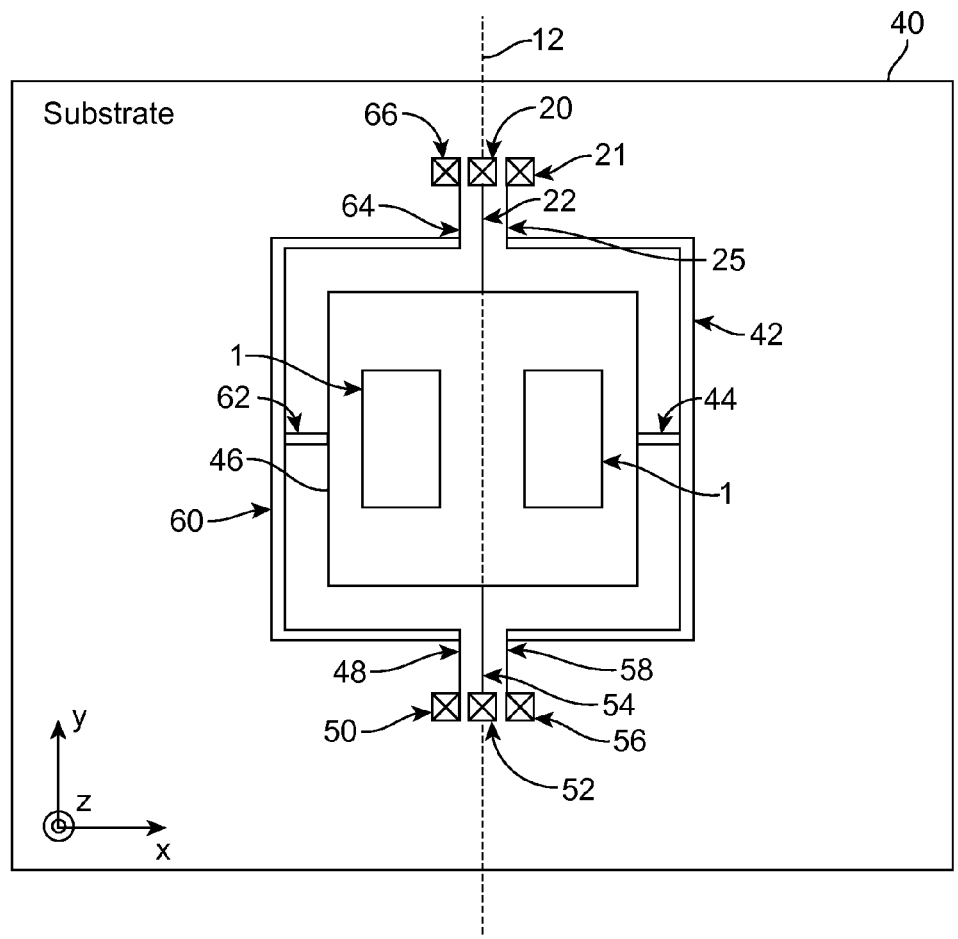
FIG. 2 shows a magnetic field sensor 40, in accordance with another embodiment of the invention.
Figure 3:
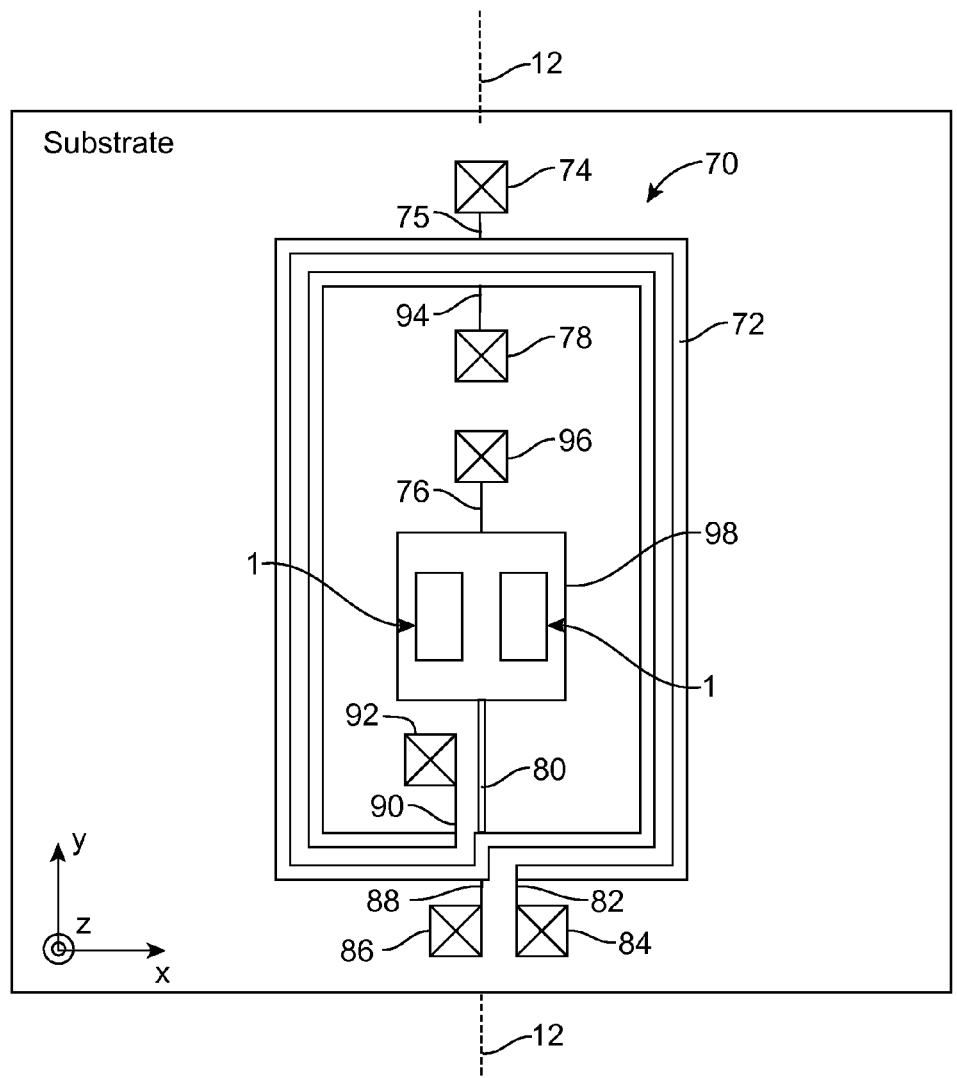
FIG. 3 shows a top view of a magnetic field sensor 70, in accordance with another embodiment of the invention.

For an x-axis magnetometer, the Lorentz torque is proportional to the length of the coil along the y-axis, the magnitude of the current and the radius from the rotational axis. Increasing the y-axis length of the coil can be achieved by different sizes and shapes of the drive coil. In various embodiments of the invention, a coil can be of a circular shape, or a rectangular shape, or any other shape. For example, a half-turn coil design is shown in FIG. 2, a single-turn coil design is shown in FIG. 1 and a double-turn coil design is shown in FIG. 3. Other coil designs are contemplated where ¾ turn coils, 1.5 turn coils and greater than double-turn coils are contemplated.

FIG. 2 shows a magnetic field sensor (magnetometer) 40, in accordance with another embodiment of the invention. Sensor 40 is analogous to sensor 10 except its driving element is made of two half-turn coils. Sensor 40 is shown to be generally symmetrical about axis 12 and includes: a sense anchor 20, a sense spring 22, a sensing element 46, a sensing spring 54, a sense anchor 52, a drive anchor 50, a drive spring 48, a drive balance spring 58, a drive balance anchor 56, a drive balance spring 25, a drive balance anchor 21, a driving element made of a drive half coil 60 and a drive balance half coil 42, a drive anchor 66, a drive spring 64, the sense coupling element 62, the electrodes 1, and the balance coupling element 44 all of which are formed parallel and suspended from the substrate. The sensing element 46, the coupling element 62, the driving element 60, the drive balance half coil 42 and the drive balance coupling element 44 are all shown coupled to the substrate. The coupling element 62 may be a compliant or a rigid element The coil 42 is shown coupled through the spring 58 to the anchor 56 and through the spring 25 to the anchor 21. The coil 60 is shown coupled through the spring 48 to the anchor 50 and through the spring 64 to the anchor 66.

During operation, in FIG. 2, an AC voltage potential is applied between drive anchor 50 and drive anchor 66 causing an AC current to flow ½ turn around the driving element 60. In the presence of an x-axis magnetic field, the current flowing in the driving element 60, along the y-axis causes a Lorentz torque about axis 12. This torque creates a motion of the driving element 60 about axis 12. The motion of the driving element 60 is transferred to the sensing element 46 via the sense coupling element 62. The out-of-plane motion of the sensing element 46 is measured to determine the x-axis magnetic field.

The half coil 42 adds symmetry to the sensor 40. Half coil 42 coil is analogous to the half coil 60 and has been mirrored about the axis of rotation, such as axis 12. The half coil 42 is suspended by the springs 58 and 25, which are connected to the substrate through the anchors 56 and 21, respectively. The coil 42 is connected to the sensing element 46 through the coupling element 44.

Similarly, half coil 60 is suspended by the springs 48 and 64, which are connected to the substrate through the anchors 50 and 66, respectively. The coil 60 is connected to the sensing element 46 through the coupling element 62.

In alternative embodiments and methods, for actuation such as that of FIG. 2, the half coil 42 is a secondary coil. In the embodiment of FIG. 2, current is driven in the half coil 42 and is also driven in the half coil 60.

FIG. 3 shows a top view of the magnetic field sensor (magnetometer) 70, in accordance with another embodiment of the invention. The sensor 70 is analogous to the sensor 10 except that its driving element 72 is a double-coil.

Sensor 70 includes: a drive anchor 74, a drive spring 75, a driving element made of a 2-turn coil 72, a sensing element 98, a sensing spring 76, a sense anchor 96, a drive spring 94, a drive anchor 78, a drive spring 90, a drive anchor 92, a drive spring 88, a drive anchor 86, a drive anchor 84, a drive spring 82 and a coupling element 80 all of which are parallel and suspended from the substrate. The sensing element 98, the coupling element 80 and the driving element 72 are shown coupled to the substrate.

The driving coil 72 is made of a double-turn coil, which circumnavigates the sense element 98 twice.

In operation, an AC voltage potential is applied between drive anchor 92 and drive anchor 84 causing an AC current to circumnavigate around the driving element 72 twice. Drive anchors 86, 74 and 78 are placed in a way to force the driving element 72 to rotate about axis 12. In the presence of an x-axis magnetic field, the current flowing in the driving element 72, along the y-axis, causes Lorentz forces to couple and create a Lorentz torque about axis 12. This torque creates a motion about axis 12. The motion of the drive coil is transferred to the sensing element via the coupling element 80. The out-of-plane motion of the sensing element 98 is measured to determine the x-axis magnetic field.

The device of FIG. 1, FIG. 2 and FIG. 3 shows symmetry about the axis of rotation, depicted as axis 12 in these figures. This symmetry has the benefit of rejecting unwanted forces. Unwanted forces can arise from off axis magnetic field, electronic noise, out-of-plane z-axis linear acceleration and from other sources. Shown in FIG. 1, FIG. 2 and FIG. 3, these magnetometers are symmetric about the axis of rotation where distributive forces are balance about the axis of rotation, shown as axis 12, and cause no net torque.

Figure 4:
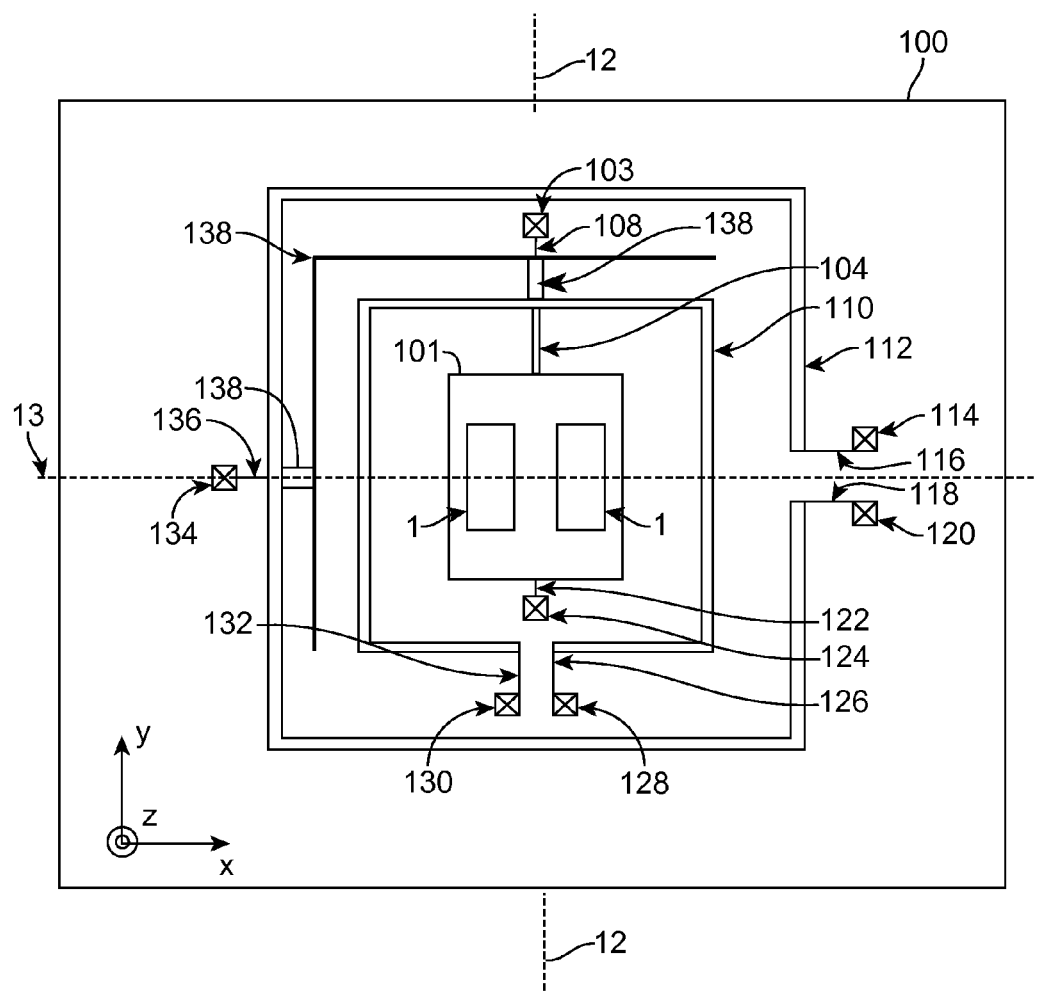
FIG. 4 shows a magnetic field sensor 100, in accordance with another embodiment of the invention.

FIG. 4 shows a magnetic field sensor (magnetometer) 100, in accordance with another embodiment of the invention. The sensor 100 is an extension of sensor 10 where a second drive coil has been added around the outside of sensor 10 so that the structure is sensitive to two in-plane axes of magnetic field.

The sensor 100 includes: a drive anchor 103, a drive spring 108, a drive coil 112 and a drive coil 110, a sensing element 101, a coupling element 104, a drive anchor 114, a drive spring 116, a drive anchor 120, a drive spring 118, a sense spring 122, a sense anchor 124, a drive anchor 128, a drive spring 126, a drive anchor 130, a drive spring 132, a drive anchor 134, the electrodes 1, a drive spring 136, and a coupling element 138. The sensing element 101, the coupling element 138, the coupling element 104, the driving element 112, the driving element 110 are all shown parallel and suspended from the substrate.

Shown in FIG. 4, the sensing element 101 is surrounded by the drive coil 110 and the drive coil 110 is surrounded by the drive coil 112. The coupling element 138, while disposed between the coils 110 and 112, is substantially L-shaped and does not and need not extend all around the coil 110.

The coil 112 is connected to the substrate through drive spring 118, 116 and 136 to drive anchors 120, 114 and 134 respectively. The coil 110 is connected to the substrate through drive spring 132, 126 and 108 to drive anchors 130, 128 and 103 respectively. The sense element 101 is connected to the substrate through the spring 122 and anchor 124. The coupler 104 connects the drive coil 110 to the sense element 101. The coupler 138 connects the drive coil 110 to drive coil 112. Therefore all components are connected to the substrate through springs and anchors The two axis sensing magnetometer consists of two drive coil structures that are concentric and laterally perpendicular to each other. To measure one axis current is driven through the outer coil and to measure the other axis current is driven through the inner coil. The two coils are joined together with a drive coupler so that motion on the inner coil causes motion on the outer coil and vice versa. The sensing element 101 is connected to the drive coils 110 and 112 and measures the motion induced from either of the connected drive coils. Motion on either the inner or outer drive coil will cause motion on the sensing element 101.

Figure 5:
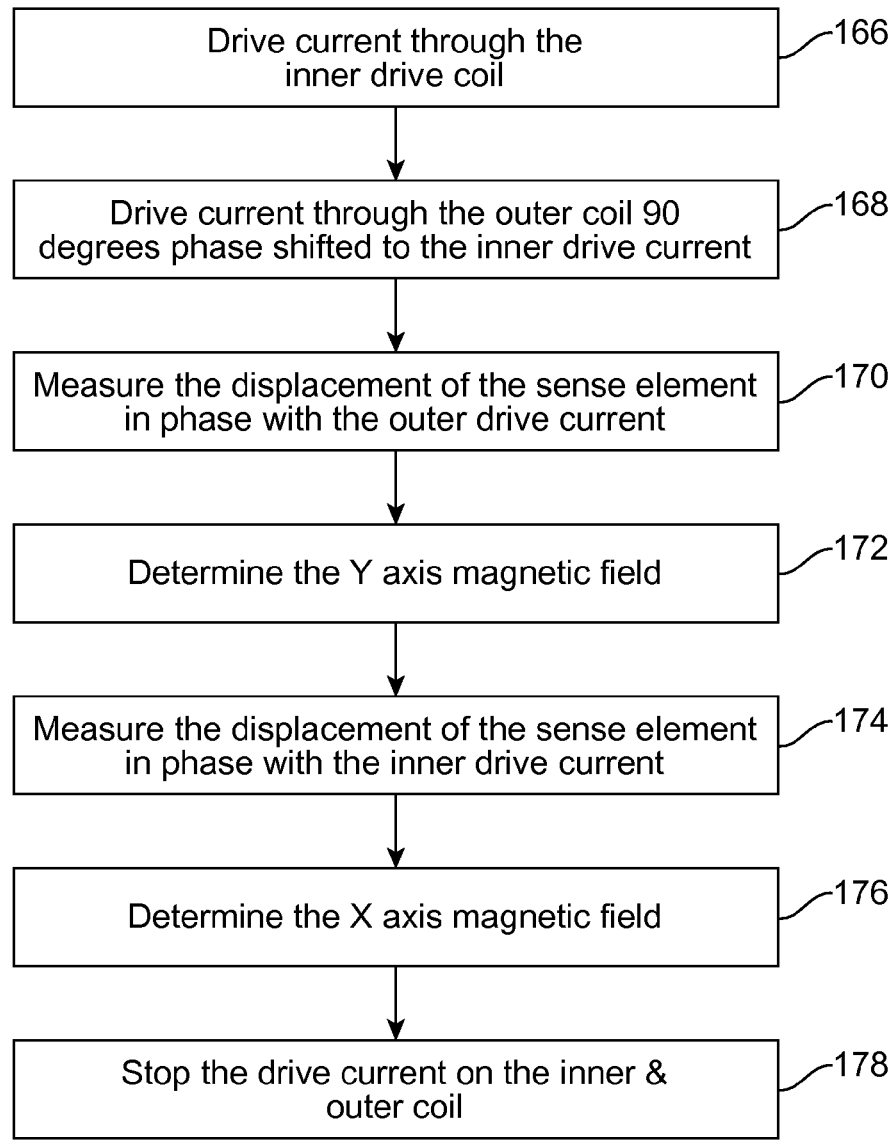
FIG. 5 shows a flow chart of the steps performed in driving current through the magnetometer of the embodiment of FIG. 4.

To distinguish the two axes of magnetic field, the sensor 100 could be operated in either in a sequential or simultaneous mode, the latter of which will be further described relative to FIG. 5. In sequential mode, each axis is excited and sensed at a different time. For simultaneous operation the two drive coils are driven at the same time but are separated in phase by substantially 90 degrees. Therefore, two axis of magnetic motion can also be separated by doing phase detection at the sensing element.

The two axis in-plane sensing magnetometer (sensor 100) of FIG. 4 is an extension of sensor 10, the inner portion is analogous to the single in-plane sensing axis magnetometer, sensor 10, of FIG. 1 and the operation is analogous to that of the sensor 10. A second outer drive section has been added and is rotated 90 degrees from the first drive coil. The second drive coil of the sensor 100 is suspended by the drive springs 118, 136, and 116. The drive springs 118, 136, and 116 are attached to the substrate through drive anchors 120, 134, and 114, respectively. The second drive is connected to the first drive coil through coupler 138 The motion of the second drive system causes motion of the first drive system and vice versa.

To sense the second axis of magnetic field a current is driven through the coil 112 by applying a voltage potential between drive anchors 120 and 114. The current in drive coil 112 along the x-axis creates a Lorentz torque about axis 13 when a y-axis magnetic field is present. This causes drive coil 112 to rotate about the axis 12 which causes the coupler 138 to rotated and apply a rotation of the drive coil 110 about axis 12. The rotation of the drive coil about axis 12 is transferred to the sensing element 101 through the drive to sense coupler 104. The out-of-plane motion of sensing element 101 is detected.

The coupling element 138 is constructed to transfer the rotational motion about axis 13 of the drive coil 112 to rotational motion about axis 12 of the drive coil 110. It is designed in such a way that it is mass balanced where an out-of-plane uniformly distributed force applied to the magnetometer structure causes no motion. Torsional compliance is included in the coupling element 138 to permit drive coil 110 and drive coil 112 to rotate about different axes. In this embodiment the compliance is derived from the low torsional stiffness of the long slender beams.

In a second embodiment of the coupling element 138 the compliance is added as a separate flexible element. The coupling element 138 comprises a first rotational lever that rotates about the axis 12, a second rotational lever that rotates about axis 13 and a flexible element connecting the first rotational lever to the second rotational leverSensor 100 can be operated in two modes; sequentially or simultaneously, as discussed in further detail relative to subsequent figures. To run each axis sequentially current is driven though drive coil 110 and the motion of the sensing element 101 determines the x-axis magnetic field then current is driven through the drive coil 112 and the motion of the sensing element 101 determines the y-axis magnetic field. The two measurements are time multiplex to separate the two outputs on the same sense element 101.

To measure simultaneously the drive coils, 110 and 112, are driven at the same time but are phase shifted substantially 90 degrees from each other. Therefore, the motion induced at the sensing element 101 is also separated by a 90 degrees phase. The two signals can be measured independently by sensing at the correct phase. Phase selection can be done by several methods including synchronous demodulation using the coil drive signal as a reference.

In FIG. 4, either the coil 110 or 112 or both can be half-turn or multi-turn coils, in alternative embodiments, analogous to that which is shown in FIG. 2 and FIG. 3.

FIG. 5 shows a flow chart of the steps performed in driving current through the magnetometer of the embodiment of FIG. 4. In FIG. 5, steps are shown for measuring the magnetic field simultaneously.

In FIG. 4, the process starts by driving (AC) current through the inner drive coil, such as the coil 110, at step 166. Next, at step 168, the drive current through the outer coil, such as the coil 112, is substantially 90 degrees phase-shifted relative to that of the inner drive current (the current at step 166). Next, at step 170, the displacement of the sense element, such as the sensing element 101, is measured, in phase with the outer drive current (the current at step 168). Next, at step 172, the magnetic field along the y-axis is measured. Next, at step 174, the displacement of the sense element is measured, in phase with the inner drive current. Next, at step 176, the magnetic field along the x-axis is determined, and at step 178, the inner drive current and the outer drive current are both stopped.

Thus, while particular embodiments have been described herein, latitudes of modification, various changes, and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

What we claim is:

1. A device comprising:
a magnetic field sensor including,
a driving element onto which a Lorentz force acts resulting in a torque about a first axis in response to a magnetic field along a second axis, the direction of the magnetic field being substantially parallel to a plane of a substrate onto which the driving element resides, the driving element being a coil through which an electric current flows;
a sensing element configured to rotate about the first axis substantially parallel to the plane of the substrate and in response to the magnetic field,
wherein the sensing element and the driving element have a symmetric structure relative to each other about the first axis;
a coupling element mechanically coupling the driving element to the sensing element, the sensing element and the coupling element being disposed in the plane, substantially parallel to the substrate; and
at least two anchors configured to connect the driving element, the sensing element, and the coupling element to the substrate.

2. The magnetic field sensor of claim 1, further comprising at least one electrode disposed between the sensing element and the substrate to form a capacitive sensor, where in capacitance of the capacitive sensor changes in response to magnetic field.

3. The magnetic field sensor of claim 1, further comprising at least one optical interferometry sensor, where the interferometer signal changes in response to magnetic field.

4. The magnetic field sensor of claim 1, further comprising a piezoresistive sensor, where in resistivity of the piezoresistor sensor changes in response to magnetic field.

5. The magnetic field sensor of claim 1, wherein the electric current is AC modulated.

6. The magnetic field sensor of claim 1, wherein the driving element is balanced about the first axis.

7. The magnetic field sensor of claim 1, wherein the driving element, the sensing element, and the coupling element are made from the same material.

8. The magnetic field sensor of claim 1, wherein the coupling element is made from a first material, and the driving element and the sense element are each made from a second material, the first material being different than the second material.

9. The magnetic field sensor of claim 1, wherein the driving element is made from a first material and the coupling element and the sense element are each made from a second material, the first material being different than the second material.

10. The magnetic field sensor of claim 1, wherein the driving element is comprising highly doped silicon of with resistivity less than 5 milli Ohm cm.

11. The magnetic field sensor of claim 1, wherein the driving element comprises metal.

12. The magnetic field sensor of claim 1, wherein the coiled-shape is a half-turn coil, single-turn or multi-turn.

13. The magnetic field sensor of claim 1, further comprising at least one electrode between the sense element and the substrate to form a capacitive sensor, wherein capacitance of the capacitive sensor changes in response to magnetic field.

14. The magnetic field sensor of claim 1, further comprising a piezoelectric sensor, wherein an output of the piezoelectric sensor changes in response to the magnetic field.

15. The magnetic field sensor of claim 1, wherein the second coupling element further comprises a first rotational lever that rotates about the first axis, a second rotational lever that rotates about a second axis and a flexible element connecting the first rotational lever to the second rotational lever.

16. The magnetic field sensor of claim 1, wherein the first electric current and the second electric current are AC modulated.

17. The magnetic field sensor of claim 1, wherein the first driving element is coiled-shaped.

18. The magnetic field sensor of claim 1, wherein the second driving element is coiled-shaped.

19. The magnetic field sensor of claim 1, wherein the coiled-shape is a half coil or a single-turn coil or a multi-turn coil.

20. The magnetic field sensor of claim 1, wherein the first driving element is balanced about the first axis.

21. The magnetic field sensor of claim 1, wherein the second driving element is balanced about the second axis.

22. The magnetic field sensor of claim 1, wherein the first driving element, the second driving element, the sensing element, the first coupling element and the second coupling element are constructed from a same material.

23. The magnetic field sensor of claim 1, wherein the first coupling element and the second coupling element is constructed from a first material, the first driving element, the second driving element and the sense element are constructed from a second material.

24. The magnetic field sensor of claim 1, wherein the first driving element and the second driving element is constructed from a first material, the first coupling element, the second coupling element and the sense element are constructed from a second material.

25. The magnetic field sensor of claim 1, wherein the first driving element and the second driving element is constructed from a low resistance material.

26. The magnetic field sensor of claim 1, wherein the low resistance material is highly doped silicon with resistivity less than 5 milli Ohm cm.

27. The magnetic field sensor of claim 1, wherein the low resistance material is metal deposited on silicon.

28. The magnetic field sensor of claim 1, wherein the low resistance material is metal.

29. A method of measuring a magnetic field along 2-axes comprising:

driving inner drive current through an inner drive coil causing displacement of the sense element related to the magnetic field;
driving outer drive current through an outer coil at a phase that is substantially ninety degrees phase shifted relative to that of the inner drive current, causing displacement of the sense element related to the magnetic field;
measuring the displacement of the sense element, in phase, using the outer drive current;
determining the magnetic field of the sense element along a first-axis;
measuring the displacement of the sense element, in phase, using the inner drive current;
determining the magnetic field of the sense element along an second-axis;
terminating the inner drive current and the outer drive current.

30. A device comprising:
a magnetic field sensor including,
  a first driving element where in, a first electric current flows through the first driving element, a Lorentz force acts on the first driving element resulting in a torque about a first axis in response to a first magnetic field along a second axis substantially parallel to a plane of a substrate;
  a second driving element where in, a second electric current flows through the second driving element, a Lorentz force acts on the second driving element resulting in a torque about the second axis in response to a second magnetic field along the first axis substantially parallel to a plane of a substrate;
  a sensing element configured to rotate about the first axis substantially parallel to the plane of the substrate in response to the first or the second magnetic field;
  a first coupling element that mechanically couples the first driving element to the second driving element;
  a second coupling element mechanically couples the first driving element to the sensing element and the first driving element, the second driving element, the sensing element, the first coupling element and the second coupling element are disposed in the plane; and
  at least two anchor configured to connect the first driving element to the substrate and at least two anchor configured to connect the second driving element to the substrate.

31. The magnetic field sensor of claim 30, further comprising at least one optical sensor for detecting motion of the sense element, wherein output of the optical sensor changes in response to the magnetic field.

32. The magnetic field sensor of claim 30, further comprising a piezoresistive sensor, wherein resistivity of the piezoresistor sensor changes in response to the magnetic field.

33. The magnetic field sensor of claim 30, wherein the coiled-shape is a half coil or a single-turn coil or a multi-turn coil.

* * * * *